United States Patent [19]
Ravanelli et al.

[11] Patent Number: 5,789,785
[45] Date of Patent: Aug. 4, 1998

[54] DEVICE FOR THE PROTECTION OF AN INTEGRATED CIRCUIT AGAINST ELECTROSTATIC DISCHARGES

[75] Inventors: Enrico Maria Alfonso Ravanelli, Monza; Fabrizio Martignoni, Morazzone, both of Italy

[73] Assignee: SGS-Thomson Microelectronics S.r.l., Agrate Brianza, Italy

[21] Appl. No.: 608,359

[22] Filed: Feb. 28, 1996

Related U.S. Application Data

[60] Provisional application No. 60/007,758 Nov. 30, 1995.

[30] Foreign Application Priority Data

Feb. 28, 1995 [EP] European Pat. Off. ............ 95830067

[51] Int. Cl.[6] ............................................. H01L 23/62
[52] U.S. Cl. ........................... 257/361; 257/362; 257/566
[58] Field of Search ................................ 257/361, 362, 257/173, 174, 566

[56] References Cited

U.S. PATENT DOCUMENTS

| | | |
|---|---|---|
| 4,100,561 | 7/1978 | Ollendorf. |
| 4,811,155 | 3/1989 | Kuriyama et al. . |
| 5,528,064 | 6/1996 | Thiel et al. .............................. 257/362 |
| 5,539,327 | 7/1996 | Shigehara et al. ......................... 326/30 |
| 5,545,914 | 8/1996 | Kumano .................................. 257/469 |

OTHER PUBLICATIONS

Patent Abstracts of Japan, vol. 017 No. 504 (E-1430), 10 Sep. 1993, & JP-A-05 129530 (Toshiba Corp.) 25 May 1993.
Patent Abstracts of Japan, vol. 014 No. 557 (E-111), 11 Dec. 1990, & JP-A-02 240959 (Toshiba Corp.; Others:01), 25 Sep. 1990.

*Primary Examiner*—Ngan V. Ngo
*Attorney, Agent, or Firm*—David V. Carlson; Seed and Berry LLP

[57] ABSTRACT

A device for protecting an integrated circuit against electrostatic discharges, and adapted for connection between a terminal and a ground of the integrated circuit, which includes a first transistor (Q2) connected between that terminal and ground by its emitter terminal and collector terminal, respectively, and a second transistor (Q1) which has its base terminal connected to the base terminal of the first transistor. The emitter and collector terminals of the second transistor (Q2) are connected to the collector of the first transistor (Q1).

32 Claims, 5 Drawing Sheets

DEVICE FOR THE PROTECTION OF AN INTEGRATED CIRCUIT AGAINST ELECTROSTATIC DISCHARGES

CROSS-REFERENCE TO RELATED APPLICATION

This application claims priority from provisional application No. 60/007,758 filed Nov. 30, 1995 and from EPC App'n 95830067.5 filed Feb. 28, 1995, both of which are hereby incorporated by reference.

BACKGROUND AND SUMMARY OF THE INVENTION

This invention relates to devices for protecting integrated circuits against electrostatic discharges, and in particular to a compact-size protector for integrated circuits using mixed type technologies and being operated on low supply voltages.

It is a recognized fact that the contact pads of an integrated circuit are liable to incidentally come in contact with electrically charged objects, both during their manufacture and during their assembly to circuitry, or while in operation. As a result, sufficient potential differences can be developed between areas or parts of the integrated circuit to damage or even destroy thin dielectrics provided in the device, such as the gate oxides of transistors of the MOS type.

Thus, as the potential difference caused by an electrostatic situation exceeds the dielectric strength of the gate isolation, a MOS transistor is made unserviceable by the electrostatic discharge which occurs through the isolation.

This is a destructive effect that, in a circuit integrated by a technology of the MOS type providing for a minimum gate dimension of 1.2 µm, for example, may already take place at a voltage as low as about 12 V, that is, at much lower values than those brought about by electrostatic discharges in some cases.

Known are several measures for protecting the input and output terminals of an integrated circuit from electrostatic discharges whose effectiveness is obviously tied to the integration characteristics.

Some of these measures provide for the use of serially connected resistors and serially or parallel connected diodes, integrated to the substrate of the integrated circuit, for limiting or "suppressing" the currents due the electric discharges, and are effective basically to protect the input terminals.

Other, more elaborate measures provide for the use of thyristor structures or SCRs (Silicon Controlled Rectifiers) and can be employed to protect both the input and output terminals, with possible modifications to keep the firing voltage low.

FIG. 1 of the drawings attached to this specification shows an input protection circuit for circuits of the BiCMOS type, i.e. with technologies of mixed types.

The transistors Q1 and Q2 jointly form an equivalent structure of a Zener diode connected between the input terminal IN and the ground of the integrated circuit GND. This type of ESD (ElectroStatic Discharge) protector and its operation are described, for instance, in a book "BiCMOS Technology and Applications", Second Edition, edited by A. R. Alvarez (Cypress Semiconductor Corporation).

That protector is quite a compact one, and readily integratable by a process of the BiCMOS type, which is highly beneficial where a protector is provided for each terminal of the integrated circuit which may come in contact with external objects.

However, it is not compatible with terminals that, in operation, may be subjected to a possibly negative dynamic range.

The underlying technical problem of this invention is to provide a protector against electrostatic discharges which is uniquely compact and fast, readily integratable even by processes of the BiCMOS type, and can be used to protect both the input and output terminals (including the power supply terminals) under any conditions of operation.

This problem is solved by an innovative protection structure in which an additional base-emitter junction is paralleled with the base-collector junction of a bipolar clamping transistor (which is connected directly from the pad to chip ground). This is advantageous because the breakdown characteristics of base-emitter junctions are different from those of base-collector junctions; by providing base-emitter junction breakdowns for both polarities of voltage excursion, better protection is achieved.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
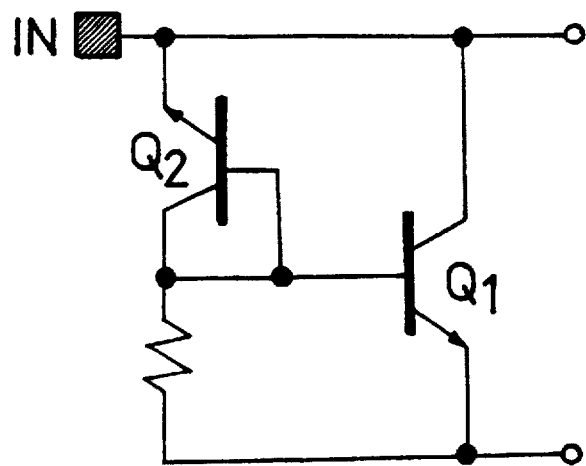
FIG. 1 shows a circuit diagram for a conventional protector as previously mentioned.
Figure 2:
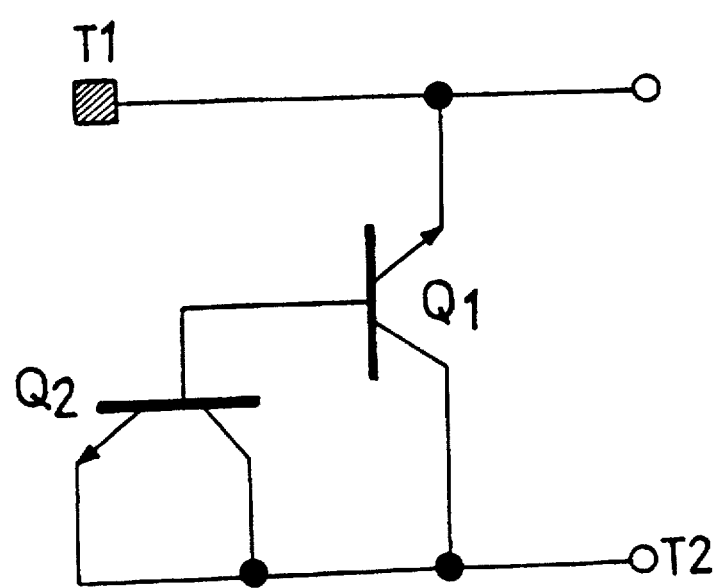
FIG. 2 shows a circuit diagram for a protector according to the invention.

The numerous innovative teachings of the present application will be described with particular reference to the presently preferred embodiment (by way of example, and not of limitation), in which:

The electrostatic discharge protection circuit shown in FIG. 2 is quite simple, and comprises first Q1 and second Q2 transistors, both of the bipolar NPN type in the preferred embodiment.

The transistor Q1 is connected between a terminal T1 to be protected and, preferably, the ground T2 of the integrated circuit incorporating the protector (or protectors, if several terminals of the integrated circuit are to be protected against electrostatic discharges) with its emitter terminal and collector terminal, respectively.

The transistor Q2 is connected to the collector terminal of the transistor Q1 with both its emitter and collector terminals, and hence to the ground T2 in this case.

The transistors Q1 and Q2 have their respective base terminals connected together.

It is always safer to have the protector connected between the terminal requiring protection and a ground connection, even where the power supply terminals are involved. Thus, in the present instance, it is better to use two protectors, one for each of the two power supply terminals, although an amount of protection could be provided by a single device connected between the two terminals.

During a positive discharge, the emitter-to-base junction of the transistor Q1 would be the subject of avalanche conduction, the transistor Q2 diode-biased, and the base-to-collector junction of the transistor Q1 operated in forward conduction.

Accordingly, the transistor Q1 works inversely in a BVcer mode of operation, and exhibits a very low output impedance.

During a negative discharge, on the other hand, it would be the emitter-to-base junction of the transistor Q2 to become the subject of avalanche conduction, so that the transistor Q1 is supplied a base current and begins to operate in the active range.

Once turned on, the transistor Q1 draws most of the current, and the series resistance of the structure is quite small.

If the transistors Q1 and Q2 are identical, the breakdown voltage of the structure is "symmetrical" for positive and negative electrostatic discharges.

In either case, the breakdown voltage will be dependent on the choice of the two transistors Q1 and Q2.

Figure 3:
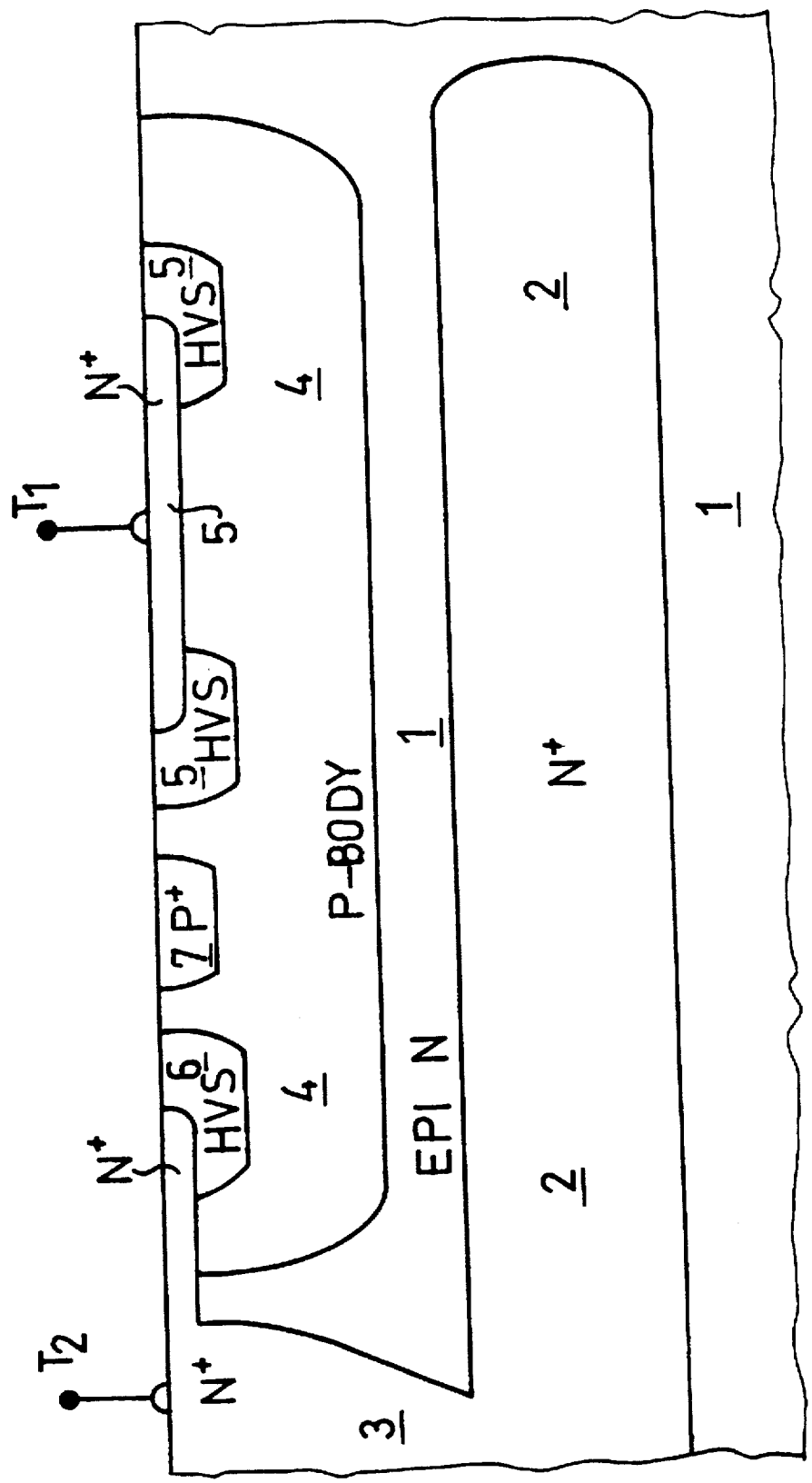
FIG. 3 is a sectional view of a viable protector structure according to the invention.
Figure 4A:
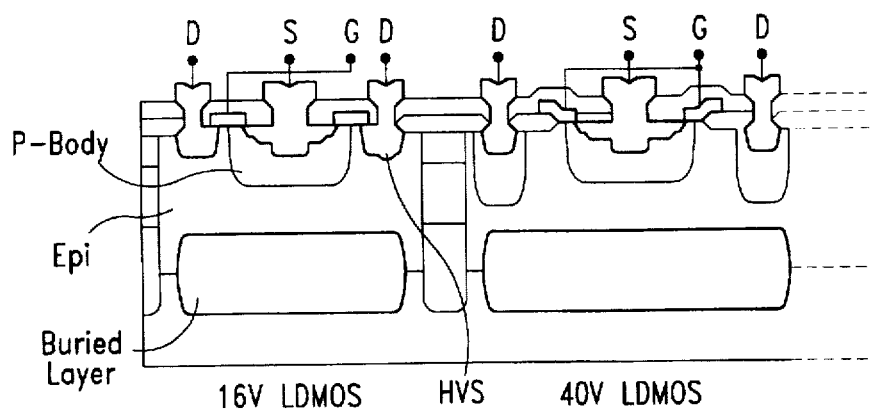
FIGS. 4A–4E are parts of a single figure, which show how the structure of FIG. 3 is integrated with other device structures in a hybrid process.
Figure 4B:
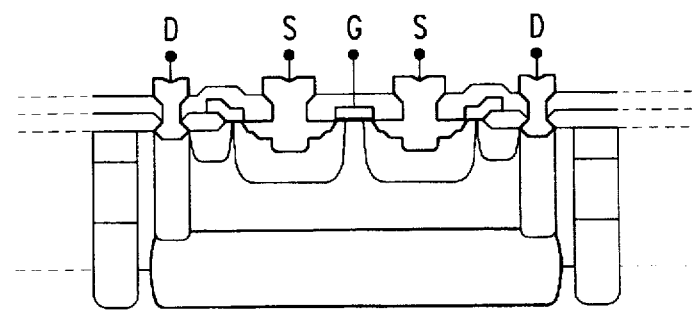
Figure 4C:
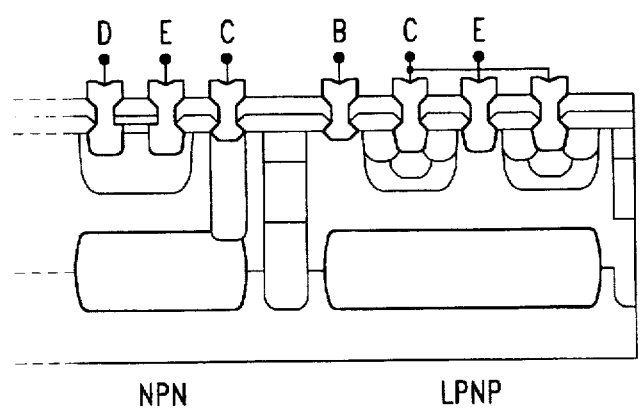
Figure 4D:
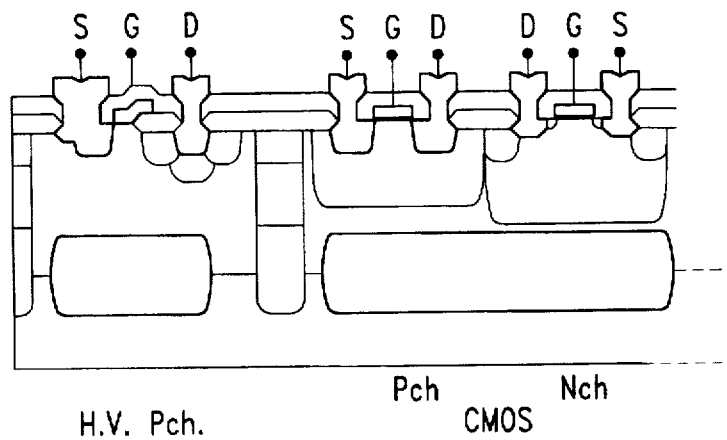
Figure 4E:
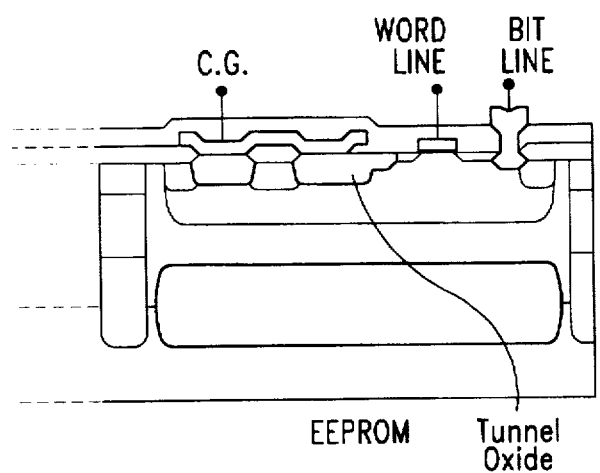

FIG. 3 is a sectional view of a viable protector structure according to the invention, which may be implemented, but not solely so, by a mixed type technology.

This structure can be formed on a monocrystalline silicon slice comprising a substrate doped with impurities of the P type and overlaid by an epitaxial layer 1 which is doped with impurities of the N type, the epitaxial layer having a thickness of 8 to 10 µm and resistivity in the 1.5 Ohm*cm range.

In growing the epitaxial layer 1, by techniques which are well known to the skilled ones in the art, a buried area or layer 2 is formed which is more heavily doped (N+) than the remainder of the layer and connected to the surface by a sinker region 3, also of the N+ type.

Formed on the epitaxial layer 1, over the buried layer 2, is a P-type or P-body surface region 4, in the present instance by boron implantation at a dosage in the range of $1*10^{13}$ cm$^{-2}$ to $3*10^{13}$ cm$^{-2}$, to a depth of about 1.25 µm.

A region 5 of the N+ type, extending into the P-body region from its surface, is formed by arsenic implantation at a dosage in the $1*10^{15}$ cm$^{-2}$ range and to a depth of about 0.3 µm.

In addition, a surface region 6 is similarly formed which extends from the sinker region 3 to an edge area of the P-body region.

Suitable means of electric connection, illustrated by leads T1 and T2 in the drawings for simplicity, but actually comprised in part of diffused regions of the N+ type and in part of paths of an electrically conductive material, such as aluminum or doped polycrystalline silicon, are formed on the regions 5 and 3 in ohmic contact therewith.

Thus, the protective circuit structure depicted in FIG. 2 has been implemented in a very simple way.

The transistor Q1 connected between the terminal T1 to be protected and a ground T2 consists of the NPN succession of the regions 5, 4 and 2, wherein the region 5 is the emitter, the P-body region is the base, and the epitaxial layer provides, specifically by its buried area 2, the collector.

This applies to the transistor Q2 as well, whose emitter is the region 6 overlying the peripheral area of the common P-body base region, while the common collector is provided by the region 2, being connected to the emitter region 6 through the sinker region 3.

Following are illustrative parameters for a sample embodiment:

thickness of the epi layer 1 (above the buried layer 2) . . . 4–6 µm;
doping of the HVS regions 6 . . . $8 \times 10^{18}$cm$^{-3}$;
junction depth of the HVS regions 6 . . . 0.8 µm;
measured voltages . . . ±11.5V.

The achievement of symmetrical breakdown voltages is quite advantageous for the reasons discussed above.

The preferred ratio of emitter areas for Q1 and Q2 is 1:1, but other ratios can alternatively be used.

In this device structure, breakdown would occur at the flat portion of the emitter-base diffusions.

It should be understood that the embodiment just described would include all those technical features which, while not essential to the invention, are nevertheless important to the proper operation of the device as a whole, whose reliability is to be ensured even on the occurrence of any electrostatic discharges.

As an example, HVS (High Voltage Shift) diffusions 6 are provided at the edges of the emitter regions 5 and have a lower dopant concentration than the core portion, in order to increase the radius of curvature of the junction edge and, therefore, better control its breakdown by avoiding the formation of destructive "hot spots".

Furthermore, interposed between the two emitter regions 5 and 6 is an area 7 of the P type which has a higher dopant concentration than the other areas of the P-body region, for the purpose of providing enhanced isolation of the two emitter regions 5 and 6 from each other.

FIGS. 4A–4E are parts of a single figure, which show how the structure of FIG. 3 is integrated with other device structures in a hybrid process. As FIGS. 4A–4E show, the n+ and body diffusions used in FIG. 3 are also used in various other locations in the hybrid process. Note that this process provides: a 16V LDMOS device; a 40V LDMOS device; a 60V (or 80V) VDMOS device; NPN and lateral PNP transistors; high-voltage PMOS devices; VLSI CMOS circuits (including NMOS and PMOS devices); and EEPROM memory. The drawing also shows how various other diffusions are advantageously shared between the different device types in the merged process.

It will be appreciated that changes, integrations and substitutions of elements may be made unto the embodiment illustratively discussed hereinabove, without departing from the protection scope of the following claims.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other elements can be added on to the proposed ESD structure if desired, to make larger or more complex structures. (For example, a small metal resistance could be interposed, to ensure that the protection device turns on before a rising edge can destroy MOS gates of the logic devices.)

What is claimed is:

1. An integrated circuit protection structure, comprising:
   a bipolar transistor comprising
      a first emitter diffusion of a first conductivity type, connected to a first contact pad;
      a first additional diffusion of said first conductivity type surrounding edges of said first emitter diffusion, said first additional diffusion being deeper and more lightly doped than said first emitter diffusion;

a body diffusion of a second conductivity type surrounding said first emitter diffusion and said additional diffusion, said body diffusion being deeper than said additional diffusion, and forming a first base-emitter junction with said first emitter diffusion; and a collector region of said first conductivity type underlying and forming a base-collector junction with said body diffusion;

a second emitter diffusion of said first conductivity type which forms a second base-emitter junction with said body diffusion, and is ohmically connected to said collector region, and is connected to a second contact pad;

a second additional diffusion of said first conductivity type surrounding edges of said second emitter diffusion;

wherein said first and second emitter diffusions have substantially identical depths and dopings;

and wherein said first and second additional diffusions have substantially identical depths and dopings, and are separate.

2. The integrated circuit structure of claim 1, wherein said first conductivity type is N-type.

3. The integrated circuit of claim 1, wherein said emitter and additional diffusions have respective contours which cause junction breakdown to occur first at flat parts of said respective base-emitter junctions.

4. The integrated circuit of claim 1, wherein said first emitter diffusion is laterally separated from said second emitter diffusion by a second-conductivity-type isolation region, which has higher doping than said body region.

5. The integrated circuit of claim 1, wherein said first contact pad is a positive power supply connection.

6. The integrated circuit of claim 1, wherein said first contact pad is a ground connection.

7. The integrated circuit of claim 1, wherein said first contact pad is a positive power supply connection, and said second contact pad is a ground connection.

8. An integrated circuit protection structure, comprising:
a bipolar transistor comprising
a first emitter diffusion of a first conductivity type, connected to a first contact pad;
a first additional diffusion of said first conductivity type surrounding edges of said first emitter diffusion, said first additional diffusion being deeper and more lightly doped than said first emitter diffusion;
a body diffusion of a second conductivity type surrounding said first emitter diffusion and said additional diffusion, said body diffusion being deeper than said additional diffusion, and forming a first base-emitter junction with said first emitter diffusion; and
a collector region of said first conductivity type underlying and forming a base-collector junction with said body diffusion;
a second emitter diffusion of said first conductivity type which forms a second base-emitter junction with said body diffusion, and is ohmically connected to said collector region, and is connected to a second contact pad;
a second additional diffusion of said first conductivity type surrounding edges of said second emitter diffusion;
wherein said first and second emitter diffusions have substantially identical depths and dopings;
and wherein said first and second additional diffusions have substantially identical depths and dopings, and are separate;
and further comprising a second-conductivity-type isolation diffusion which is laterally positioned, within said body region, between said first and second additional diffusions, to provide isolation therebetween.

9. The integrated circuit structure of claim 8, wherein said first conductivity type is N-type.

10. The integrated circuit of claim 8, wherein said emitter and additional diffusions have respective contours which cause junction breakdown to occur first at flat parts of said respective base-emitter junctions.

11. The integrated circuit of claim 8, wherein said first emitter diffusion is laterally separated from said second emitter diffusion by a second-conductivity-type isolation region, which has higher doping than said body region.

12. The integrated circuit of claim 8, wherein said first contact pad is a positive power supply connection.

13. The integrated circuit of claim 8, wherein said first contact pad is a ground connection.

14. The integrated circuit of claim 8, wherein said first contact pad is a positive power supply connection, and said second contact pad is a ground connection.

15. An integrated circuit structure, comprising:
a protection device which includes:
a bipolar transistor comprising a first emitter diffusion of a first conductivity type, connected to a first contact pad; a first additional diffusion of said first conductivity type surrounding edges of said first emitter diffusion, said first additional diffusion being deeper and more lightly doped than said first emitter diffusion; and a body diffusion of a second conductivity type surrounding said first emitter diffusion and said additional diffusion, said body diffusion being deeper than said additional diffusion, and forming a first base-emitter junction with said first emitter diffusion; and a collector region of said first conductivity type underlying and forming a base-collector junction with said body diffusion;
a second emitter diffusion of said first conductivity type which forms a second base-emitter junction with said body diffusion, and is ohmically connected to said collector region, and is connected to a second contact pad;
a second additional diffusion of said first conductivity type surrounding edges of said second emitter diffusion;
wherein said first and second emitter diffusions have substantially identical depths and dopings, and wherein said first and second additional diffusions have substantially identical depths and dopings, and are separate; and
a DMOS device including source, body, and drain regions, wherein said body region of said DMOS device has the same doping profile as said body region of said transistor of said protection device.

16. The integrated circuit structure of claim 15, wherein said first conductivity type is N-type.

17. The integrated circuit of claim 15, wherein said emitter and additional diffusions have respective contours which cause junction breakdown to occur first at flat parts of said respective base-emitter junctions.

18. The integrated circuit of claim 15, wherein said first emitter diffusion is laterally separated from said second emitter diffusion by a second-conductivity-type isolation region, which has higher doping than said body region.

19. The integrated circuit of claim 15, wherein said first contact pad is a positive power supply connection.

20. The integrated circuit of claim 15, wherein said first contact pad is a ground connection.

21. The integrated circuit of claim 15, wherein said first contact pad is a positive power supply connection, and said second contact pad is a ground connection.

22. An integrated circuit ESD protection method, comprising the steps of:

provide a first bipolar transistor having a first-conductivity-type emitter diffusion thereof connected to a first external terminal, and having a collector diffusion thereof connected to a first external terminal, and having a base diffusion; and providing a second bipolar transistor having a first-conductivity-type emitter diffusion thereof connected to said second external terminal, and having a collector diffusion thereof connected to said second external terminal, and having a base diffusion connected to said base diffusion of said first bipolar transistor;

wherein out-of-specification voltages of a first polarity will forward-bias the emitter-base junction of said first bipolar transistor to turn on said first transistor and thereby clamp the voltage of said first external terminal;

and wherein out-of-specification voltages of a second polarity will forward-bias the emitter-base junction of said second bipolar transistor to turn on said first transistor and thereby clamp the voltage of said first external terminal.

23. The method of claim 22, wherein said emitter diffusions of said first and second transistors have equal areas.

24. A protection circuit against electrostatic discharges, monolithically integratable in an integrated circuit device and adapted for connection between an external terminal and a ground of the integrated circuit, comprising:

first and second transistors, each having first and second current-carrying terminals and a control terminal;

said first transistor being connected between said terminal and said ground, respectively by its first and second terminals, and said second transistor having its control terminal connected to the control terminal of the first transistor and having both its first and second terminals connected to the second terminal of the first transistor.

25. A protection circuit according to claim 24, characterized in that the first and second transistors are bipolar transistors, and the first and second terminals and the control terminal form the transistor emitter terminal, collector terminal and base terminal, respectively.

26. A protector device against electrostatic discharges for a monolithically integrated circuit on a semiconductor material substrate having a first type of conductivity, comprising a first region with a second type of conductivity being the opposite of the first type, which region extends into the substrate from a surface thereof, characterized in that said first region includes at least a second region having the first type of conductivity and extending in said first region from said surface, said second region being connected electrically to a terminal of the integrated circuit, characterized in that it comprises at least a third region having the first type of conductivity and extending from said surface into an area of the substrate and a peripheral area of the first region, which third region is connected electrically to a ground of the integrated circuit.

27. A protection device according to claim 26, characterized in that at least a portion of the third region is doped with impurities at a higher concentration than the impurities used for doping the substrate and also extends on the substrate into an area underlying the first region.

28. A protection device according to claim 26, characterized in that the second region has a peripheral portion which surrounds a core portion having at least one area where it extends into the first region less deeply than in the peripheral portion, said peripheral portion being doped with impurities at a lower concentration than in said at least one area.

29. A protection device according to claim 27, characterized in that the second region has a peripheral portion which surrounds a core portion having at least one area where it extends into the first region less deeply than in the peripheral portion, said peripheral portion being doped with impurities at a lower concentration than in said at least one area.

30. A protection device according to claim 26, characterized in that the third region has a peripheral portion which extends into the first region less deeply than a non-peripheral portion being doped with impurities at a higher concentration than in the peripheral portion.

31. A protection device according to claim 27, characterized in that the third region has a peripheral portion which extends into the first region less deeply than a non-peripheral portion being doped with impurities at a higher concentration than in the peripheral portion.

32. A protection device according to claim 28, characterized in that the third region has a peripheral portion which extends into the first region less deeply than a non-peripheral portion being doped with impurities at a higher concentration than in the peripheral portion.

* * * * *